(12) United States Patent
Lin et al.

(10) Patent No.: US 7,994,020 B2
(45) Date of Patent: Aug. 9, 2011

(54) METHOD OF FORMING FINNED SEMICONDUCTOR DEVICES WITH TRENCH ISOLATION

(75) Inventors: Ming-ren Lin, Cupertino, CA (US); Zoran Krivokapic, Santa Clara, CA (US); Witek Maszara, Morgan Hill, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 348 days.

(21) Appl. No.: 12/176,866

(22) Filed: Jul. 21, 2008

(65) Prior Publication Data

US 2010/0015778 A1   Jan. 21, 2010

(51) Int. Cl.
*H01L 21/76* (2006.01)
(52) U.S. Cl. .................. 438/443; 438/283; 257/E21.54
(58) Field of Classification Search .................. 438/283, 438/443
See application file for complete search history.

(56) References Cited

U.S. PATENT DOCUMENTS

| 6,872,647 B1 * | 3/2005 | Yu et al. |
| 6,921,963 B2 * | 7/2005 | Krivokapic et al. |
| 2006/0090445 A1 | 5/2006 | McLean et al. |
| 2006/0134868 A1 | 6/2006 | Yoon et al. |
| 2006/0141706 A1 | 6/2006 | Hong |
| 2008/0029821 A1 | 2/2008 | Yamagami et al. |
| 2008/0121970 A1 | 5/2008 | Aritome |

OTHER PUBLICATIONS

International Search Report for PCT Application PCT/US2009/004211 mailed Nov. 9, 2009.

* cited by examiner

*Primary Examiner* — Alexander G Ghyka
(74) *Attorney, Agent, or Firm* — Ingrassia Fisher & Lorenz, P.C.

(57) ABSTRACT

A method of manufacturing a semiconductor device structure, such as a FinFET device structure, is provided. The method begins by providing a substrate comprising a bulk semiconductor material, a first conductive fin structure formed from the bulk semiconductor material, and a second conductive fin structure formed from the bulk semiconductor material. The first conductive fin structure and the second conductive fin structure are separated by a gap. Next, spacers are formed in the gap and adjacent to the first conductive fin structure and the second conductive fin structure. Thereafter, an etching step etches the bulk semiconductor material, using the spacers as an etch mask, to form an isolation trench in the bulk semiconductor material. A dielectric material is formed in the isolation trench, over the spacers, over the first conductive fin structure, and over the second conductive fin structure. Thereafter, at least a portion of the dielectric material and at least a portion of the spacers are etched away to expose an upper section of the first conductive fin structure and an upper section of the second conductive fin structure, while preserving the dielectric material in the isolation trench. Following these steps, the fabrication of the devices is completed in a conventional manner.

13 Claims, 11 Drawing Sheets

METHOD OF FORMING FINNED SEMICONDUCTOR DEVICES WITH TRENCH ISOLATION

TECHNICAL FIELD

Embodiments of the subject matter described herein relate generally to semiconductor devices and related manufacturing processes. More particularly, embodiments of the subject matter relate to methods of forming semiconductor devices, such as FinFET devices, having trench isolation.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry.

A FinFET is a type of transistor that can be fabricated using very small scale processes. FIG. 1 is a simplified perspective view of a FinFET 100, which is formed on a semiconductor wafer substrate 102. A FinFET is named for its use of one or more conductive fins (FinFET 100 includes only one fin 104). As shown in FIG. 1, fin 104 extends between a source region 106 and a drain region 108 of FinFET 100. FinFET 100 includes a gate structure 110 that is wrapped around fin 104. The dimensions of fin 104 wrapped by gate structure 110 determine the effective channel of FinFET 100. FIG. 2 is a simplified perspective view of another FinFET 200; this particular version includes three fins 202 extending between a source region 204 and a drain region 206. As with FinFET 100, a gate structure 208 is formed across the three fins 202. When multiple fins are employed in this manner, it can be extremely important to maintain uniform fin thickness and uniform fin pitch (the distance between two adjacent fins, plus fin thickness).

FinFET devices have historically been formed using silicon-on-insulator (SOI) substrates. Using an SOI substrate, the conductive fins are formed from the silicon material, while the insulator layer provides isolation between adjacent FinFET devices. Bulk silicon substrates are less expensive than SOI substrates, and FinFET devices can also be fabricated using bulk silicon if appropriate isolation methodologies are utilized. One known isolation methodology for FinFETs formed from a bulk silicon substrate requires multiple photolithography and etching steps to create the trenches between n-channel and p-channel transistor devices. The cost and complexity of such multiple photolithography and etching steps can overshadow the benefits of using a bulk silicon substrate rather than SOI.

BRIEF SUMMARY

A FinFET fabrication technique as described herein can be utilized with a bulk semiconductor substrate, and can be used in conjunction with different process technologies. The fabrication technique creates isolation trenches between adjacent FinFET devices without requiring additional photolithography and etching steps. The resulting isolation trenches are self-aligned relative to the edges of the adjacent FinFET devices (e.g., adjacent PMOS and NMOS transistor devices).

The above and other aspects may be carried out by an embodiment of a trench isolation method for finned semiconductor devices. The method involves forming, from a bulk semiconductor substrate, a first conductive fin set and a second conductive fin set, the first conductive fin set and the second conductive fin set being separated by a gap. The method then deposits an oxide material over the first conductive fin set, the second conductive fin set, and the bulk semiconductor substrate. The oxide material forms a recess that corresponds to the gap, where the recess is defined by opposing sidewalls of the oxide material. The recess is deepened into the bulk semiconductor substrate to form a trench that is self-aligned with the opposing sidewalls, and the trench is filled with a dielectric material.

A method of manufacturing a semiconductor device structure is also provided. The method involves providing a substrate comprising a bulk semiconductor material, a first conductive fin structure formed from the bulk semiconductor material, and a second conductive fin structure formed from the bulk semiconductor material, where the first conductive fin structure and the second conductive fin structure are separated by a gap. The method forms spacers in the gap and adjacent the first conductive fin structure and the second conductive fin structure, and then etches the bulk semiconductor material, using the spacers as an etch mask, to form an isolation trench in the bulk semiconductor material. A dielectric material is placed in the isolation trench, over the spacers, over the first conductive fin structure, and over the second conductive fin structure, and the dielectric material is subsequently etched, along with the spacers, to expose an upper section of the first conductive fin structure and an upper section of the second conductive fin structure, while preserving the dielectric material in the isolation trench. An alternate embodiment of this method removes the spacers before forming the dielectric material in the isolation trench, over the first conductive fin structure, and over the second conductive fin structure.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor transistor devices are well known and so, in the interest of brevity, many conventional steps will only be mentioned briefly herein or will be omitted entirely without providing the well known process details.

The techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

A variety of FinFET devices and related fabrication processes are known. For example, U.S. Pat. Nos. 6,872,647 and 6,921,963—both assigned to Advanced Micro Devices, Inc.—are related to FinFETs and processes for manufacturing FinFETs (the relevant content of these two patents is incorporated by reference herein). In accordance with the traditional manufacturing techniques described in these two patents, conductive fins in a FinFET device are formed using photolithography, etching, and other conventional process steps. FinFET performance is dependent on the thickness and pitch of fins, and the thickness and pitch should be uniform and closely controlled during manufacturing. In this regard, fabricating FinFETs using modern semiconductor manufacturing processes (e.g., 32 nm and smaller technologies) can be challenging due to the importance of controlling the dimensions of the fins.

Figure 1:
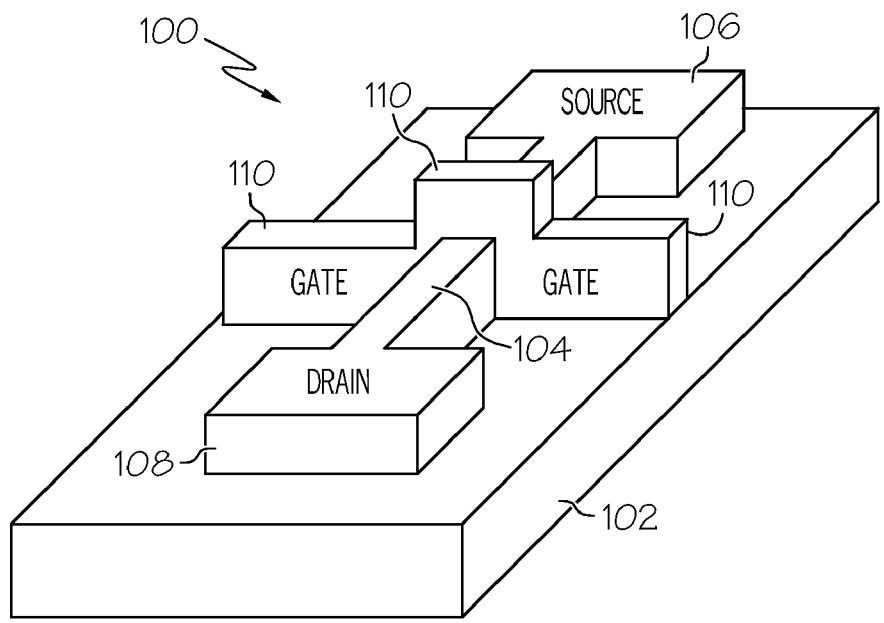
FIG. 1 is a simplified perspective view of a conventional FinFET.
Figure 2:
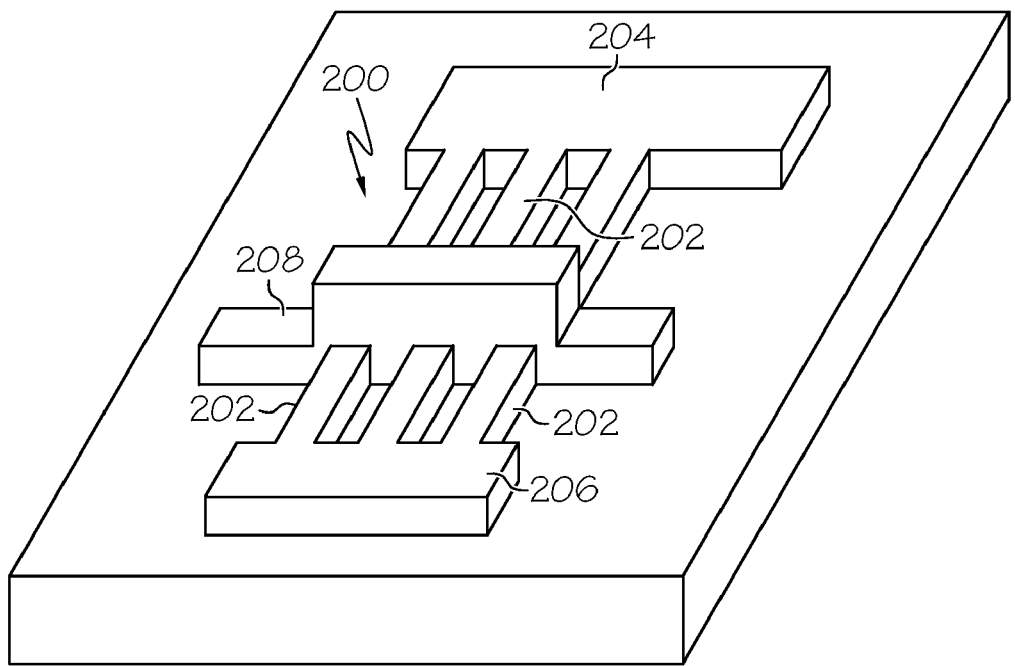
FIG. 2 is a simplified perspective view of a conventional FinFET having a plurality of fins.
Figure 3:
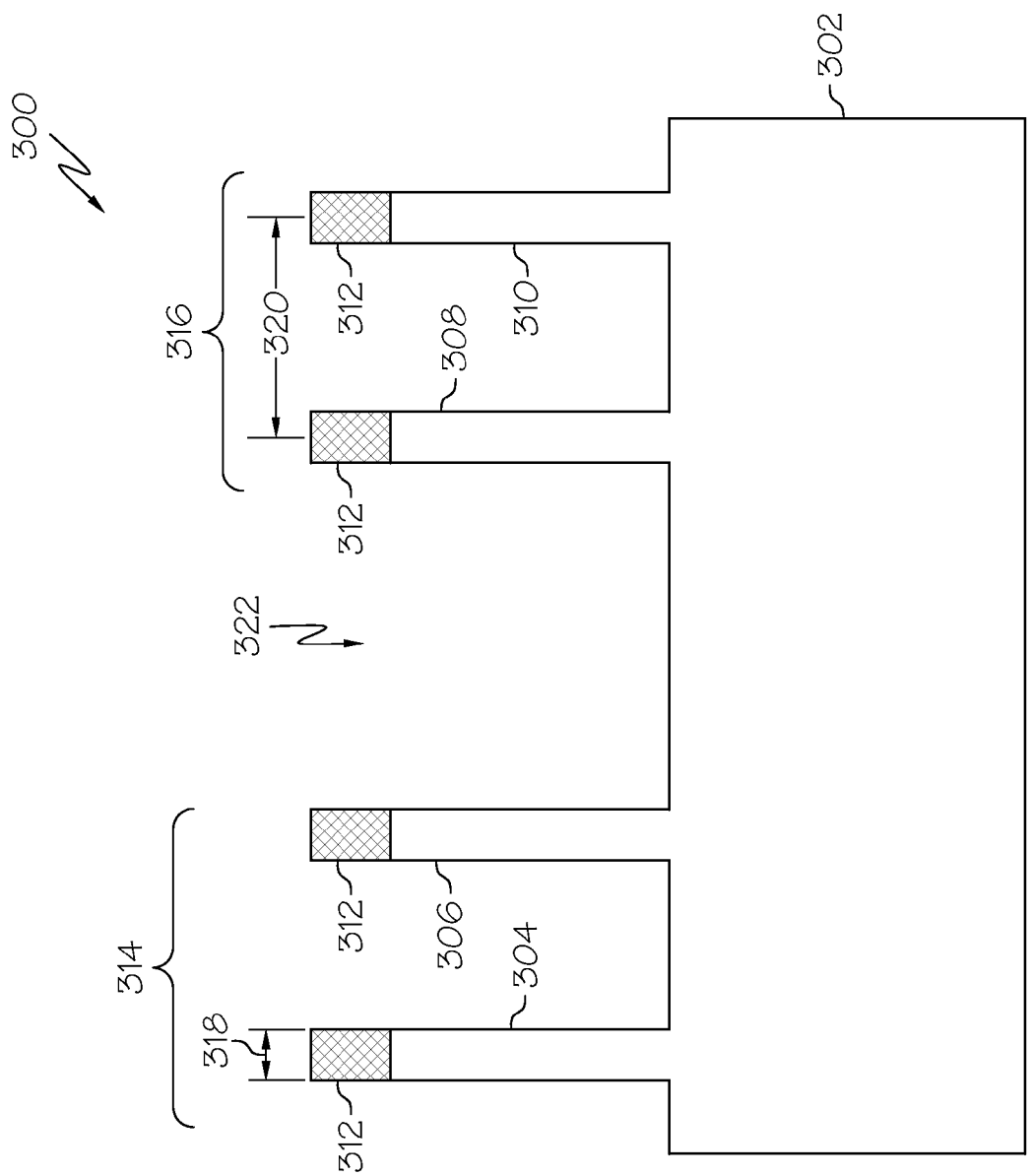
FIGS. 3-10 are cross sectional views that illustrate an embodiment of a semiconductor device structure and a related fabrication method.

The techniques and technologies described herein can be utilized to form isolation regions between adjacent FinFET devices formed on a bulk semiconductor substrate. FIGS. 3-10 are cross sectional views that illustrate an embodiment of a semiconductor device structure 300 and an exemplary method of fabricating it. This fabrication process represents one implementation of a trench isolation method that is suitable for use with finned semiconductor devices, such as FinFETs. FIG. 3 depicts the semiconductor device structure 300 at an intermediate stage of the fabrication process, namely, after providing a suitable substrate, formation of conductive fins on the substrate, and formation of nitride caps on the conductive fins. For this particular embodiment, semiconductor device structure 300 utilizes a bulk semiconductor substrate, such as a bulk silicon substrate 302. The term "silicon substrate" is used herein to encompass the generally monocrystalline and relatively pure silicon materials typically used in the semiconductor industry. Bulk silicon substrate 302 can originally be either N-type or P-type silicon, but is typically P-type, and bulk silicon substrate 302 is subsequently doped in an appropriate manner to form active regions. Here, the conductive fins are formed from bulk silicon substrate 302 in a conventional manner.

Again, FIG. 3 illustrates semiconductor device structure 300 in a state after the formation of a plurality of conductive fins 304, 306, 308, and 310 from bulk silicon substrate 302, and after formation of silicon nitride caps 312 on the top of the fins. The combination of a conductive fin and its overlying nitride cap may be referred to herein as a "conductive fin structure." The fins and caps are formed using well known techniques and process steps (e.g., techniques and steps related to photolithography and patterning, sidewall image transfer, etching, material growth, material deposition, surface planarization, and the like). Conductive fins 304 and 306 together form a first conductive fin set 314, and conductive fins 308 and 310 form a second conductive fin set 316. Although semiconductor device structure 300 includes two fins per set, alternate embodiments need not be so configured. Indeed, a conductive fin set may include any number of fins, including one. Moreover, the number of fins in first conductive fin set 314 need not be equal to the number of fins in second conductive fin set 316 (due to mobility differences, there are usually more p-type device fins than n-type device fins). After fabrication of semiconductor device structure 300 is complete, the first set 314 will be utilized for a first device (e.g., an NMOS transistor device), and the second set 316 will be utilized for a second device (e.g., a PMOS transistor device), where the two devices are isolated from one another.

The conductive fins in each set are formed such that they have a uniform pitch and a uniform fin thickness. In practice, the fin pitch and thickness will typically be the same for both conductive fin sets 314 and 316. In FIG. 3, the arrow 318 represents the fin thickness of conductive fin 304, and the arrow 320 represents the pitch between the two adjacent and neighboring fins 308 and 310. In some embodiments, the fin thickness can be within the range of about 10-60 nm (preferably about 10-20 nm), and the fin pitch can be within the range of about 30-300 nm (preferably about 40-50 nm). For certain embodiments, the conductive fins are about 40-70 nm high, and silicon nitride caps 312 are about 20-40 nm high. It should be appreciated that these exemplary dimensions are provided to establish a convenient and realistic frame of reference, and that the actual dimensions of a practical embodiment of semiconductor device structure 300 might vary.

First conductive fin set 314 and second conductive fin set 316 are separated by a gap 322, which is generally defined between conductive fin 306 and conductive fin 308. Notably, the gap 322 separates first conductive fin set 314 from second conductive fin set 316 by a distance that is greater than the designated fin pitch 320 for semiconductor device structure 300. The gap 322 may represent the space that would otherwise be occupied by at least one conductive fin formed in accordance with the designated fin pitch 320. For example, semiconductor device structure 300 represents an embodiment where the gap 322 would otherwise accommodate only one conductive fin. Other embodiments may utilize a wider gap that might correspond to more than one "missing" conductive fin.

Figure 4:
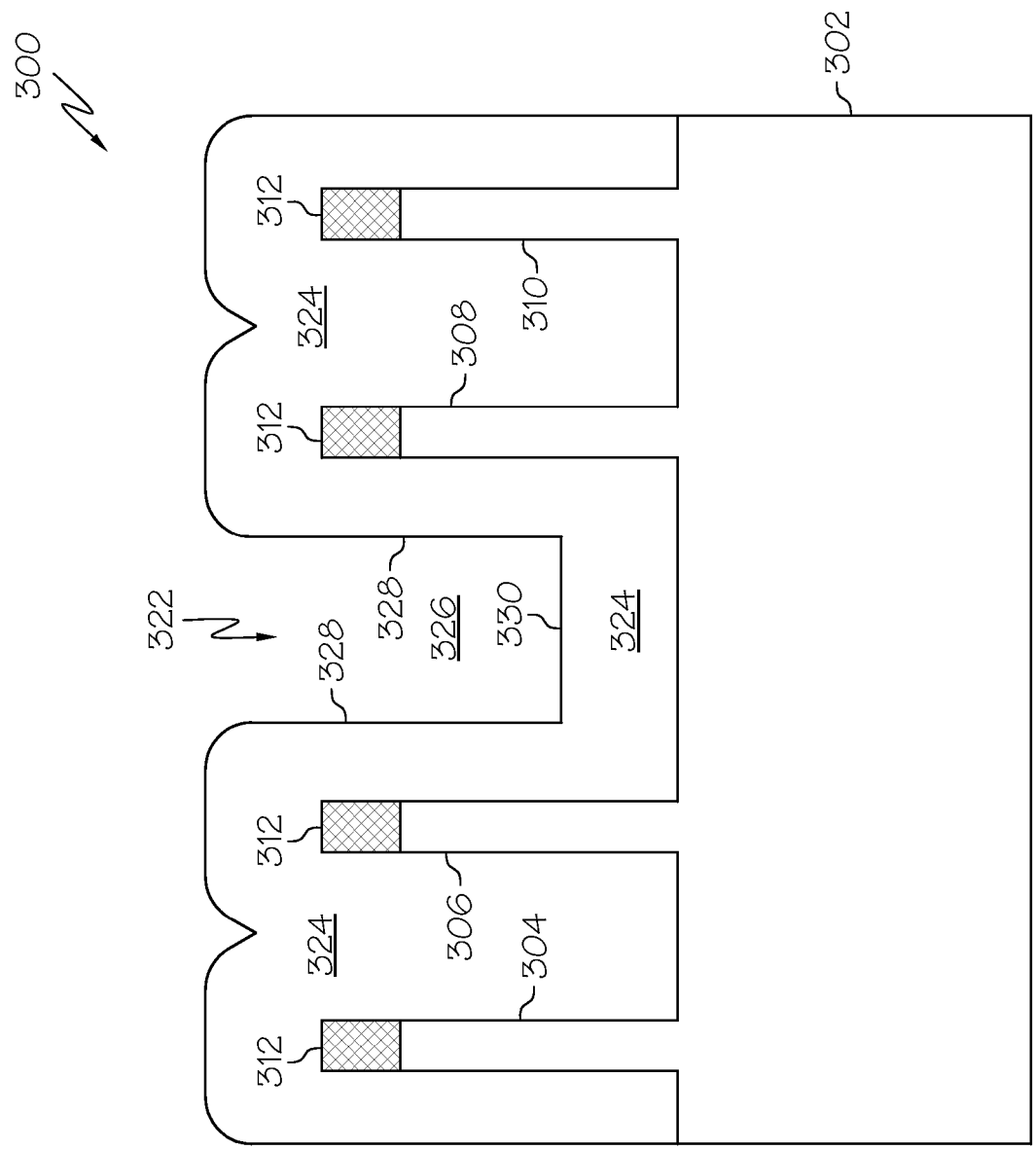

Although other fabrication steps or sub-processes may be performed after the step in the process depicted in FIG. 3, this example continues by depositing an insulator material, such as an oxide (preferably, silicon oxide) over the first conductive fin set 314, over the second conductive fin set 316, and over the bulk silicon substrate 302 (FIG. 4). In other words, the oxide material 324 is deposited in a blanket manner to cover the exposed surfaces of semiconductor device structure 300. As depicted in FIG. 4, after deposition, the oxide material 324 fills in the spaces between adjacent fins in each conductive fin set, and lines the space defined by the gap 322. If this deposition step is controlled properly, then oxide material 324 will not completely fill the gap 322, and the oxide material 324 will generally follow the overall contour of the gap 322. For the illustrated embodiment, the oxide material 324 is deposited to a thickness of about 25-30 nm.

The deposition of the oxide material 324 results in the formation of a recess 326 that generally corresponds to the location and contour of the gap 322. This recess 326 is defined by certain features of oxide material 324. In particular, recess 326 is bounded by the opposing sidewalls 328 of oxide material 324, and by the lowermost exposed surface 330 of oxide material 324.

Figure 5:
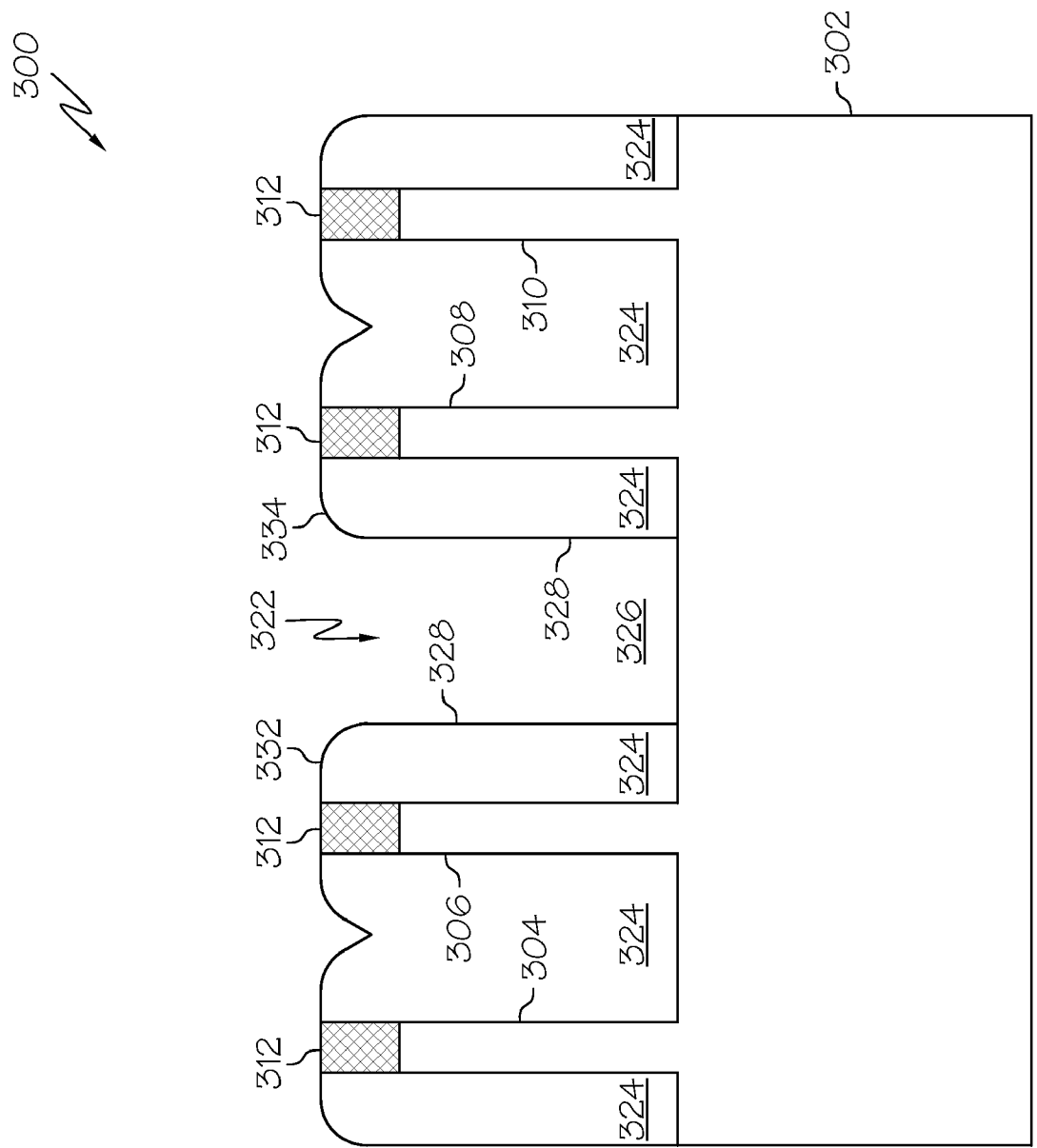

Although other fabrication steps or sub-processes may be performed after the formation of oxide material 324, this example continues with an etching step, which preferably employs an anisotropic etch technique (i.e., a directional etch). FIG. 5 depicts the result of anisotropically etching oxide material 324 to extend recess 326 to the bulk silicon substrate 302. In other words, recess 326 now terminates at bulk silicon substrate 302. The etchant chemistry used in this step selectively etches oxide material 324 while leaving silicon nitride caps 312 and bulk silicon substrate 302 substantially intact. The anisotropic nature of this etching step forms spacers 332 and 334 in gap 322. Spacer 332 is adjacent to conductive fin 306, and spacer 334 is adjacent to conductive fin 308. These spacers 332 and 334 are often referred to as sidewall spacers. Indeed, spacers 332 and 334 are generally aligned with, and correspond to, the opposing sidewalls 328 of the originally deposited oxide material 324.

Figure 6:
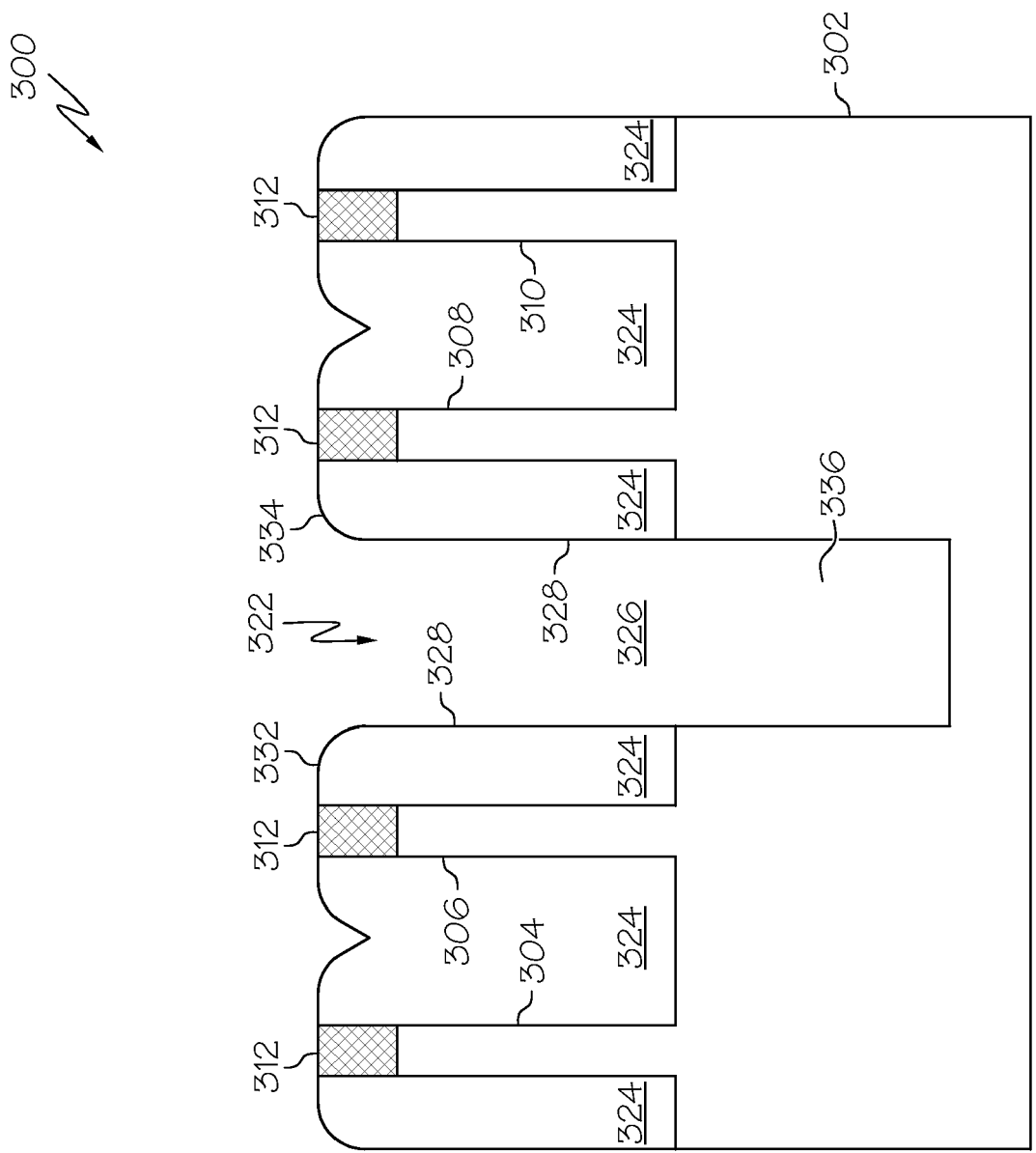

Although other fabrication steps or sub-processes may be performed after the formation of spacers 332 and 334, this example continues with another etching step (FIG. 6). The etchant chemistry used in this step selectively etches silicon while leaving oxide material 324 and silicon nitride caps 312 substantially intact. This etching step preferably utilizes an anisotropic etch technique to etch the bulk silicon substrate 302, using oxide material 324 as an etch mask. More specifically, spacers 332 and 334 serve as a hard etch mask to form an isolation trench 336 in the bulk silicon substrate 302. Notably, this etching step deepens recess 326 into bulk silicon substrate 302 to form isolation trench 336, which is self-aligned with opposing sidewalls 328 (and, therefore, self-aligned with spacers 332 and 334). In certain embodiments, isolation trench 336 is etched to a depth within the range of about 0.15-0.50 μm (with a preferred depth of about 0.15 μm).

Figure 7:
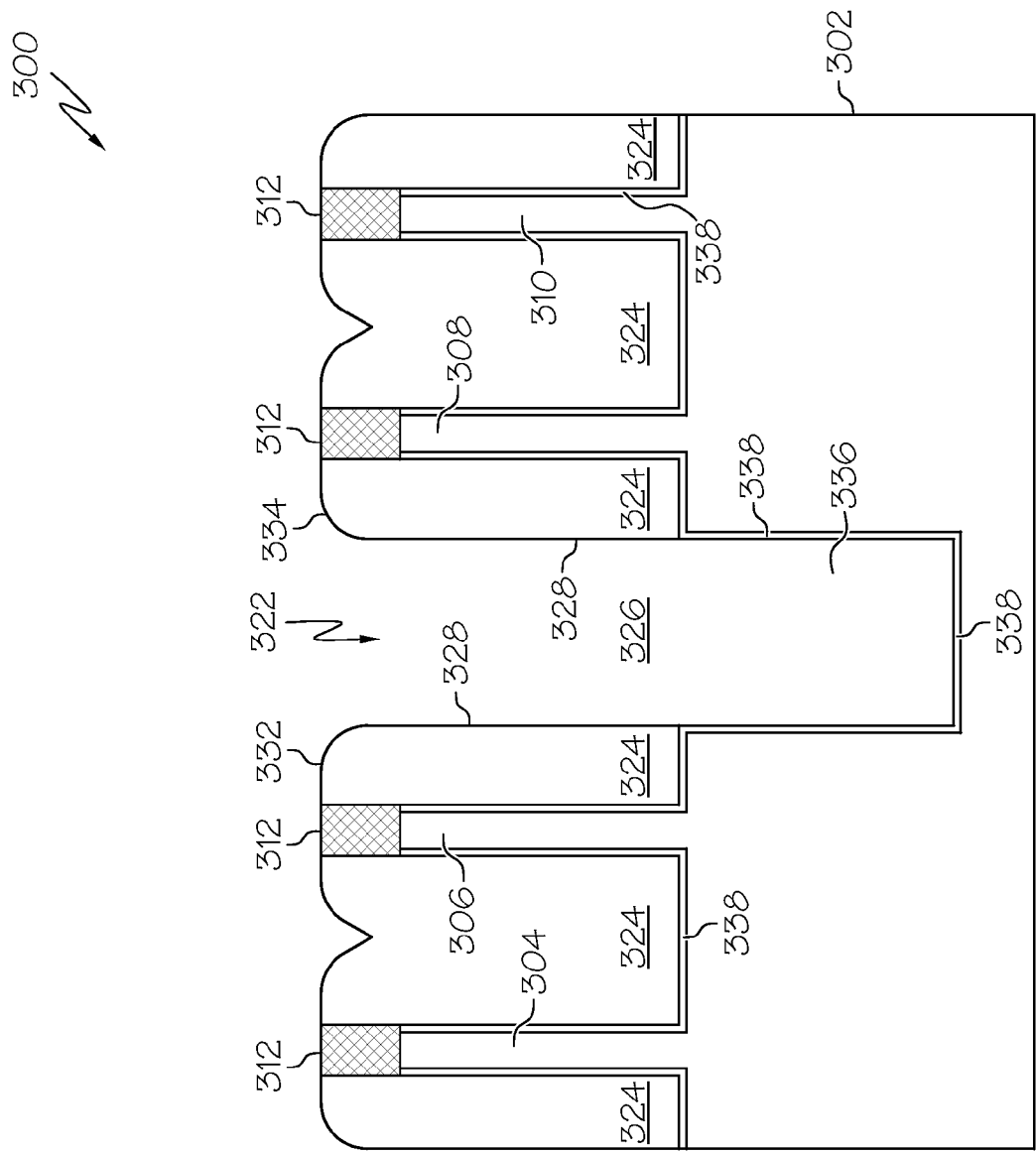

FIG. 7 depicts the state of semiconductor device structure 300 after completion of an optional re-oxidation step. This optional step may be performed to repair the silicon material interface, which typically suffers some damage during etching. In accordance with conventional re-oxidation techniques, semiconductor device structure 300 will be exposed to oxygen while being maintained at a high temperature, which results in the oxidation of the exposed silicon material in isolation trench 336. FIG. 7 depicts this resulting oxide layer 338 using an exaggerated scale for ease of illustration. Notably, this re-oxidation step also oxidizes the conductive fins because in this embodiment the oxide material 324 does not serve as an adequate oxygen barrier. Thus, if this optional re-oxidation step is included in the fabrication process, then the original fin width and fin pitch may need to be controlled to accommodate the narrowing of the fins caused by the formation of the oxide layer 338.

Figure 8:
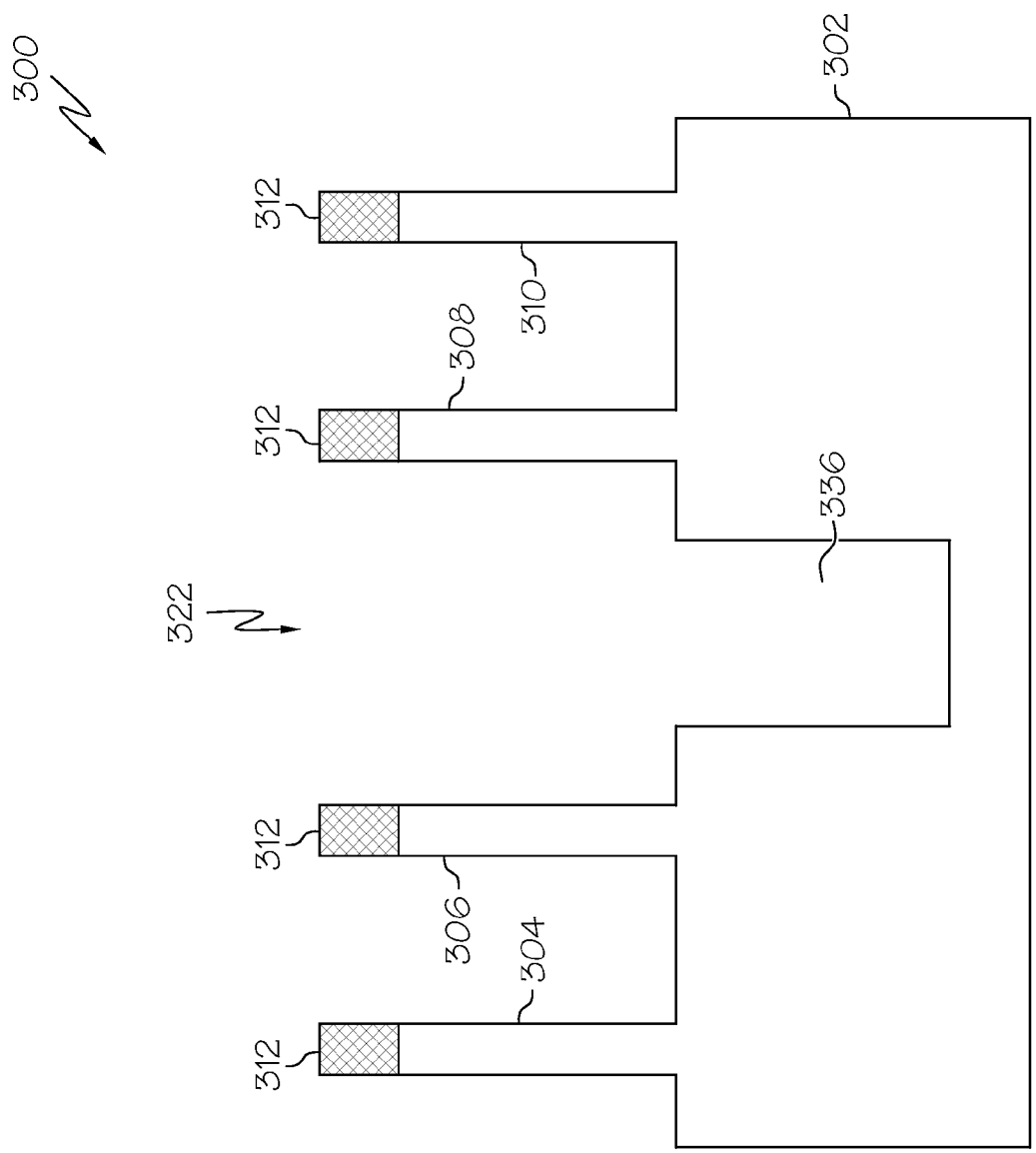

For the sake of brevity and simplicity, the following description assumes that the optional re-oxidation step is not performed. Accordingly, although other fabrication steps or sub-processes may be performed after the formation of isolation trench 336, this example continues by removing the oxide material 324, including spacers 332 and 334, from semiconductor device structure 300. FIG. 8 depicts the state of semiconductor device structure 300 after removal of the oxide material 324. In practice, oxide material 324 is removed during a suitable etching step, which preferably employs an isotropic wet etch technique using, for example, a diluted HF chemistry. This wet oxide etch selectively etches oxide material 324 while leaving silicon nitride caps 312 and bulk silicon substrate 302 substantially intact. As shown in FIG. 8, this etching step exposes conductive fins 304, 306, 308, and 310, along with silicon nitride caps 312. Removal of oxide material 324 is preferred to improve the uniformity (device-to-device and wafer-to-wafer) and controllability of the subsequent process steps described below.

Figure 9:
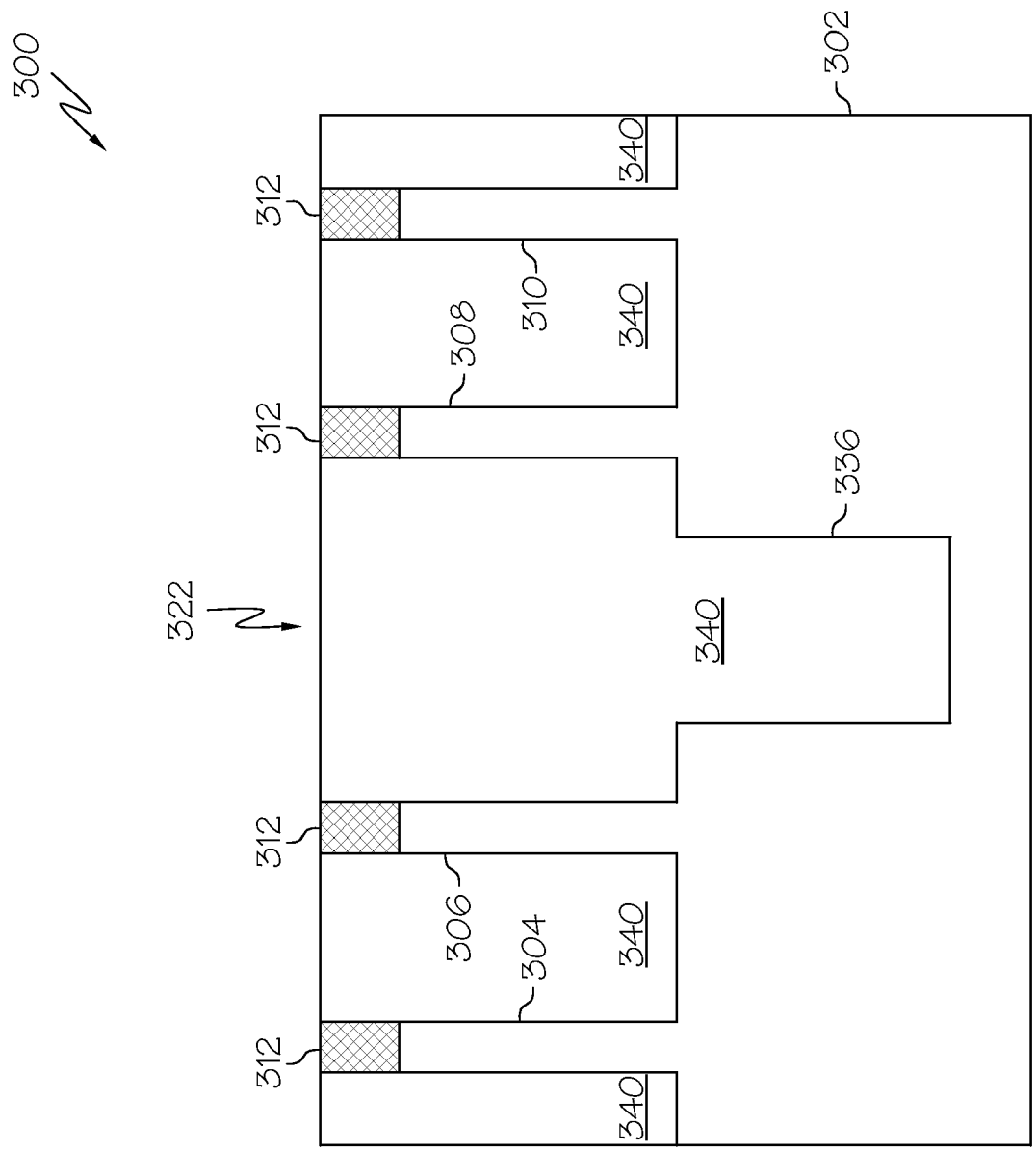

Although other fabrication steps or sub-processes may be performed after the removal of spacers 332 and 334, this example continues by filling isolation trench 336 with a suitable dielectric material (FIG. 9). In practice, a dielectric material 340 can be formed in isolation trench 336, over conductive fins 304, 306, 308, and 310, over silicon nitride caps 312, and over bulk silicon substrate 302 using, for example, an appropriate deposition technique such as chemical vapor deposition. In certain embodiments, the dielectric material 340 is silicon dioxide deposited using tetraethyl orthosilicate (TEOS) as a silicon source (commonly referred to as TEOS oxide).

FIG. 9 illustrates the condition of semiconductor device structure 300 after deposition of dielectric material 340, and after dielectric material 340 has been polished or planarized. For example, chemical mechanical polishing may be performed to polish the TEOS oxide to the height of the conductive fin structures. In this regard, FIG. 9 shows how silicon nitride caps 312 can be used to control the polishing such that the resulting height of the TEOS oxide corresponds to the height of silicon nitride caps 312.

Figure 10:
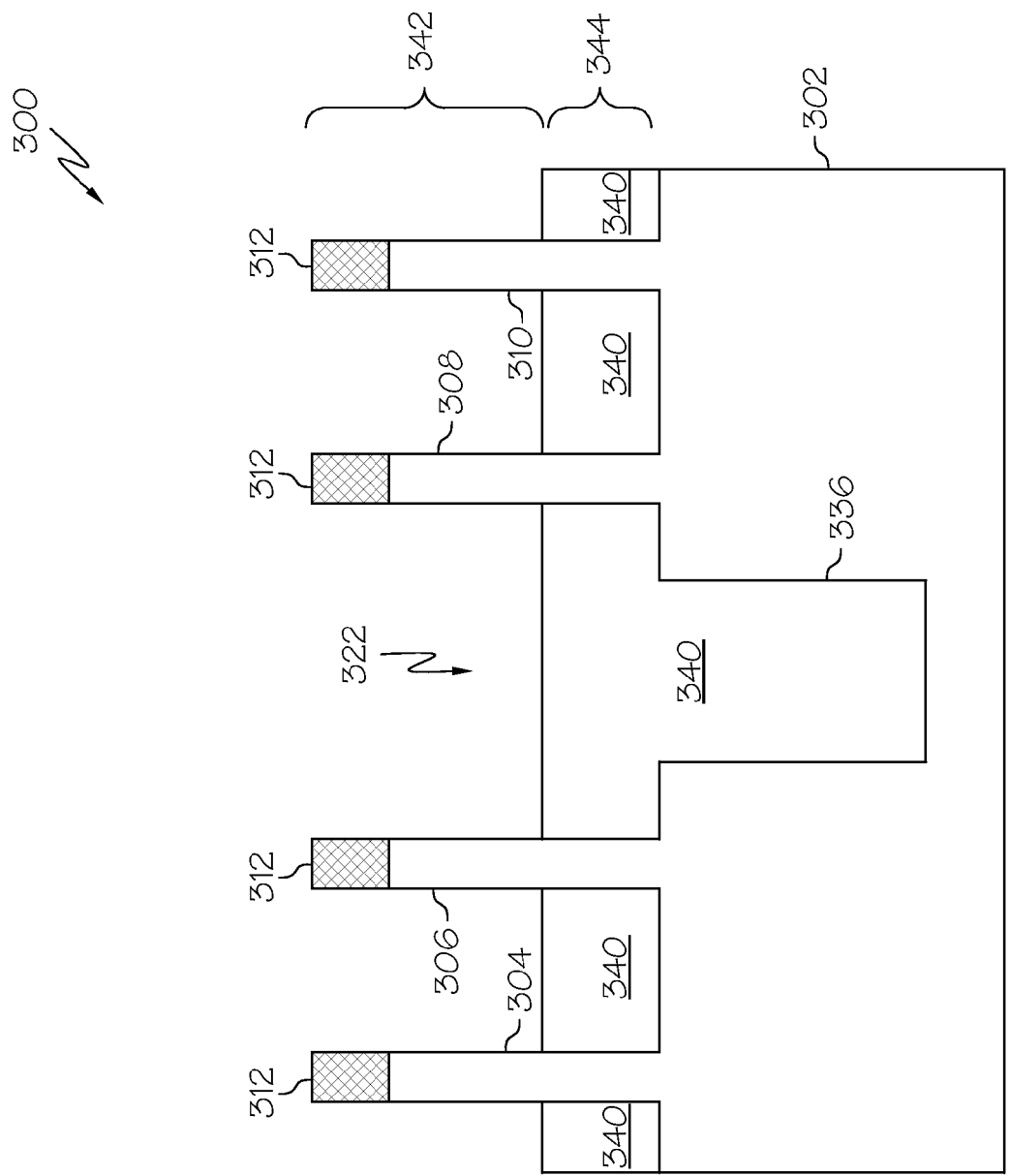

Although other fabrication steps or sub-processes may be performed after the formation of dielectric material 340 as shown in FIG. 9, this example continues by reducing the height of dielectric material 340. FIG. 10 depicts the state of semiconductor device structure 300 after at least a portion of dielectric material 340 has been removed. In preferred embodiments, dielectric material 340 is removed during a timed endpoint etch that selectively etches the TEOS oxide material while leaving the conductive fins, the caps 312, and bulk silicon substrate 302 substantially intact. In this regard, the duration of the etching step is controlled to achieve the desired remaining height of the TEOS oxide material, and such that the layer of dielectric material 340 is uniformly recessed.

Referring to FIG. 10, the etching of dielectric material 340 exposes an upper section 342 of each conductive fin structure. In other words, silicon nitride caps 312 and the upper lengths of the conductive fins become exposed due to the etching of dielectric material 340 to a remaining height relative to the conductive fins. Notably, the dielectric material 340 that resides in isolation trench 336 is preserved. This serves to electrically isolate the two adjacent device structures from one another. Moreover, a layer 344 of the dielectric material 340 is retained at the base of the conductive fins. This layer 344 is utilized during subsequent process steps. For example, layer 344 of dielectric material 340 can be used to enable ion implantation into the underlying bulk silicon substrate 302.

Thereafter, any number of known process steps can be performed to complete the fabrication of the first device structure (which in this example includes conductive fins 304 and 306) and to complete the fabrication of the second device structure (which in this example includes conductive fins 308 and 310). In practice, the first device structure may be an NMOS transistor device structure, and the second device structure may be a PMOS transistor device structure, and the dielectric material 340 in isolation trench 336 serves to isolate the NMOS and PMOS transistor device structures.

Figure 11:
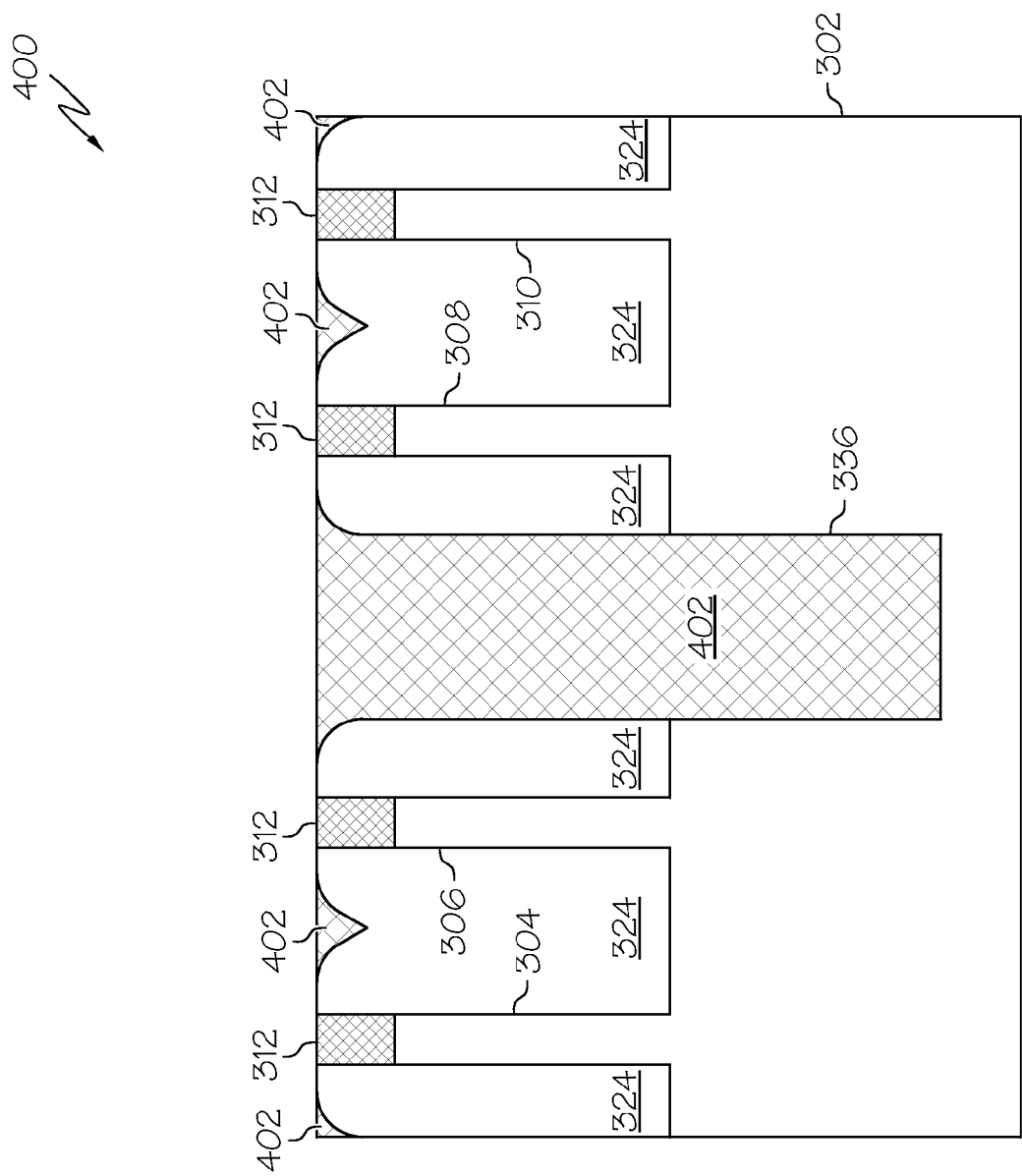
FIGS. 11 and 12 are cross sectional views that illustrate an alternate embodiment of a semiconductor device structure and steps of a related fabrication method.
Figure 12:
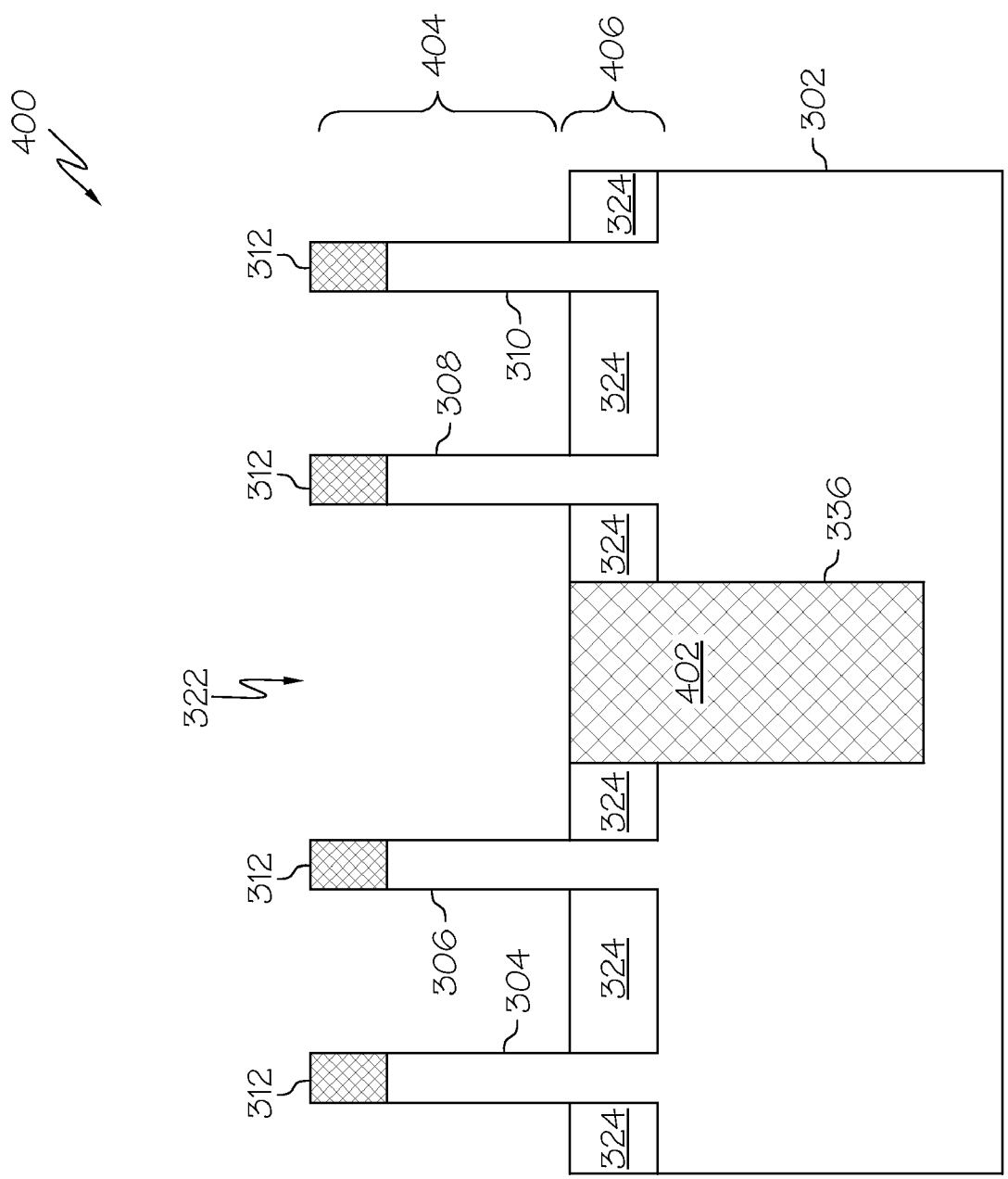

Referring back to the state of semiconductor device structure 300 depicted in FIG. 6, an alternate fabrication process may proceed in a different manner than that described above. In this regard, FIGS. 11 and 12 are cross sectional views that illustrate an alternate embodiment of a semiconductor device structure 400 and steps of a related fabrication method. Referring to FIG. 11, this alternate embodiment does not remove oxide material 324 or spacers 332 and 334. Instead, a dielectric material 402 is formed in isolation trench 336, over oxide material 324 (which includes spacers 332 and 334), and over the conductive fin structures (which include the conductive fins 304, 306, 308 and 310, and the corresponding silicon nitride caps 312). In practice, the dielectric material 402 may be, for example, an oxide that is grown by heating the silicon in an oxidizing ambient (i.e., thermally grown oxide rather than a deposited oxide).

FIG. 11 illustrates the condition of semiconductor device structure 400 after deposition of dielectric material 402, and after dielectric material 402 has been polished or planarized. For example, chemical mechanical polishing may be performed to polish the dielectric material 402 to the height of the conductive fin structures. In this regard, FIG. 11 depicts some dielectric material 402 in the upper surface depressions of oxide material 324. Notably, silicon nitride caps 312 can be used to control the polishing such that the resulting height of the dielectric material 402 corresponds to the height of silicon nitride caps 312.

Although other fabrication steps or sub-processes may be performed after the formation of dielectric material 402 as shown in FIG. 11, this example continues by etching at least a portion of the dielectric material 402 and at least a portion of oxide material 324 (including spacers 332 and 334). FIG. 12 depicts the state of semiconductor device structure 400 after completion of this etching step. In practice, the fabrication process employs a timed endpoint etching technique and an appropriate etchant chemistry that selectively etches dielectric material 402 and oxide material 324, while leaving the conductive fins, the silicon nitride caps 312, and bulk silicon substrate 302 substantially intact.

Referring to FIG. 12, the etching of dielectric material 402 and oxide material 324 exposes an upper section 404 of each conductive fin structure, as explained above with reference to FIG. 10. Notably, the dielectric material 402 that resides in isolation trench 336 is preserved, and a layer 406 of the oxide material 324 is retained at the base of the conductive fins, as described above for the other embodiment. It should be appreciated that the state of semiconductor device structure 400 depicted in FIG. 12 is similar and functionally equivalent to the state of semiconductor device structure 300 depicted in FIG. 10.

Thereafter, any number of known process steps can be performed to complete the fabrication of the device structures in semiconductor device structure 400. Again, conductive fins 304 and 306 may form part of an NMOS transistor device structure, conductive fins 308 and 310 may form part of an adjacent PMOS transistor device structure, and the dielectric material 402 located in isolation trench 336 serves to isolate the NMOS and PMOS transistor device structures from each other.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of manufacturing a semiconductor device structure, the method comprising:
providing a substrate comprising a bulk semiconductor material, a first conductive fin structure formed from the bulk semiconductor material, and a second conductive fin structure formed from the bulk semiconductor material, the first conductive fin structure and the second conductive fin structure being separated by a gap;
forming spacers in the gap and adjacent the first conductive fin structure and the second conductive fin structure, wherein the spacers are formed from an oxide material, and wherein forming the spacers fills in spaces between adjacent fins in each of the first and second conductive fin structures with the oxide material;
etching the bulk semiconductor material, using the spacers as an etch mask, to form an isolation trench in the bulk semiconductor material;
forming a dielectric material in the isolation trench, over the spacers, over the first conductive fin structure, over the second conductive fin structure, and over the oxide material in the spaces between adjacent fins in each of the first and second conductive fin structures; and
etching a portion of the dielectric material, a portion of the spacers, and a portion of the oxide material in the spaces between adjacent fins in each of the first and second conductive fin structures to expose an upper section of the first conductive fin structure and an upper section of the second conductive fin structure, while preserving the dielectric material in the isolation trench and preserving some of the oxide material in the spaces between and at the base of the adjacent fins in each conductive fin structure.

2. The method of claim 1, wherein forming spacers comprises:
depositing the oxide material over the first conductive fin structure, the second conductive fin structure, and the bulk semiconductor material, the oxide material forming a recess that corresponds to the gap; and
anisotropically etching the oxide material such that the recess extends to the bulk semiconductor material.

3. The method of claim 1, wherein etching the bulk semiconductor material forms the isolation trench such that it is self-aligned with the spacers.

4. The method of claim 1, further comprising polishing the dielectric material to a height of the first conductive fin structure and the second conductive fin structure, prior to etching the portion of the dielectric material and the portion of the spacers.

5. The method of claim 4, wherein the step of etching the portion of the dielectric material and the portion of the spacers uses an endpoint etching technique.

6. The method of claim 1, further comprising:
completing fabrication of a first device structure that includes the first conductive fin structure; and
completing fabrication of a second device structure that includes the second conductive fin structure; wherein the dielectric material in the isolation trench electrically isolates the first device structure from the second device structure.

7. A method of manufacturing a semiconductor device structure, the method comprising:
providing a substrate comprising a bulk semiconductor material, a first conductive fin structure formed from the bulk semiconductor material, and a second conductive fin structure formed from the bulk semiconductor material, the first conductive fin structure and the second conductive fin structure being separated by a gap;
forming spacers in the gap and adjacent the first conductive fin structure and the second conductive fin structure;
etching the bulk semiconductor material, using the spacers as an etch mask, to form an isolation trench in the bulk semiconductor material;
removing the spacers to expose conductive fins of the first and second conductive fin structures;
forming a dielectric material in the isolation trench, between adjacent conductive fins in the first conductive fin structure, between adjacent conductive fins in the second conductive fin structure, over the first conductive fin structure, and over the second conductive fin structure; and
etching a portion of the dielectric material to expose an upper section of the first conductive fin structure and an upper section of the second conductive fin structure, while preserving the dielectric material in the isolation trench, and retaining a layer of the dielectric material between and at the base of the adjacent fins in each conductive fin structure.

8. The method of claim 7, wherein forming spacers comprises:
depositing an oxide material over the first conductive fin structure, the second conductive fin structure, and the bulk semiconductor material, the oxide material forming a recess that corresponds to the gap; and
anisotropically etching the oxide material such that the recess extends to the bulk semiconductor material.

9. The method of claim 7, wherein etching the bulk semiconductor material forms the isolation trench such that it is self-aligned with the spacers.

10. The method of claim 7, further comprising polishing the dielectric material to a height of the first conductive fin structure and the second conductive fin structure, prior to etching at least a portion of the dielectric material.

11. The method of claim 10, wherein the step of etching at least a portion of the dielectric material uses an endpoint etching technique.

12. The method of claim 7, further comprising:
completing fabrication of an NMOS transistor device structure that includes the first conductive fin structure; and
completing fabrication of a PMOS transistor device structure that includes the second conductive fin structure; wherein
the dielectric material in the isolation trench electrically isolates the NMOS transistor device structure from the PMOS transistor device structure.

13. The method of claim 7, wherein removing the spacers comprises selectively etching away the spacers.

* * * * *